United States Patent

Möder

[11] 4,426,589
[45] Jan. 17, 1984

[54] LOW-LOSS SEMICONDUCTOR SWITCHING CIRCUIT

[75] Inventor: Helmut Möder, Stuttgart, Fed. Rep. of Germany

[73] Assignee: Robert Bosch GmbH, Stuttgart, Fed. Rep. of Germany

[21] Appl. No.: 332,747

[22] Filed: Dec. 21, 1981

[30] Foreign Application Priority Data

Jan. 17, 1981 [DE] Fed. Rep. of Germany ....... 3101412

[51] Int. Cl.³ .................... H03K 3/01; H03K 17/60
[52] U.S. Cl. ................................. 307/254; 307/255; 307/270
[58] Field of Search .................... 307/254, 255, 270; 318/681, 563, 565, 566, 674

[56] References Cited

U.S. PATENT DOCUMENTS

| | | | |
|---|---|---|---|
| 3,160,766 | 12/1964 | Reymand | 307/255 |
| 3,206,651 | 9/1965 | Prouly | 307/254 |
| 3,660,684 | 5/1972 | Padgett et al. | 307/270 |
| 3,854,057 | 12/1974 | Williams et al. | 307/270 |
| 4,329,600 | 5/1982 | Stewart | 307/270 |

FOREIGN PATENT DOCUMENTS 2650673 5/1976 Fed. Rep. of Germany .

Primary Examiner—Stanley D. Miller
Assistant Examiner—B. P. Davis
Attorney, Agent, or Firm—Frishauf, Holtz, Goodman, Woodward

[57] ABSTRACT

To reduce further switching energy arising upon changing-of-state of a semiconductor switch pair, connected to a load (17), particularly an inductive load, switching dissipating networks (6, 7), each including a storage capacitor (9, 12) which receive and accept switching energy in the respective semiconductor switch (4, 5), are interconnected by an additional network (15, 16; 20; 21-26) to place the respective capacitors, effectively, in parallel for additional energy storage and provide a single network for current flow upon changing-of-state of the respective switch to the capacitors, the energy represented by the current flow being retrievable by forming the additional network (FIG. 3), for example, as a voltage converter, e.g. a blocking oscillator, permitting feedback of the recovered switching energy to a supply source (1, 3) which may be a storage battery.

15 Claims, 3 Drawing Figures

LOW-LOSS SEMICONDUCTOR SWITCHING CIRCUIT

The present invention relates to semiconductor switching circuits, and more particularly to bilateral switching circuits switching current flow to a load which is so arranged that switching losses in the semiconductor switching circuits are reduced.

BACKGROUND

Semiconductor switching circuits have been proposed in which a network is provided which protects the semiconductor power switch, for example a switching transistor, and which includes a capacitor, a diode, and a resistor network. Power which is dissipated within the semiconductor switch upon changing between conductive and non-conductive state is thereby reduced, so that a given semiconductor can be used to switch higher currents, or switch at higher voltage levels, than possible without the auxiliary protective network. The switching power which arises upon changing state by the semiconductor is transferred, at least in part, into the resistor or resistors of the switching network and dissipated therein in the form of heat. This arrangement, thus, transfer switching losses from the semiconductor to an element which is more susceptible to head radiation. Yet, the commutating energy which arises within the semiconductor switch upon each switching event is dissipated in the resistors, and hence wasted. Each one of the semiconductor switches requires its own protective and heat dissipating network.

Bilateral switching circuits have been proposed in which direct current is connected to a load to flow, respectively, in reverse directions. Typically, such a load is a motor, or a portion thereof, for example the armature or the field, and the load, thus, is inductive. Typically, two semiconductor switching elements are used, each with its own protective or power dissipating network, one, each, connected into a main line to the load and controlling current flow in a respective direction thereto.

THE INVENTION

It is an object to reduce dissipated energy which arises in switching of loads within semiconductor switches and, further, to reduce the requirement for circuit components.

Briefly, two semiconductor switches are provided, each having a respective network including, for example, diodes and a capacitor to accept and control energy upon switching of the respective semiconductor between conductive and non-conductive state; the two networks do not include dissipating elements, such as a resistor, for example, but rather are interconnected by an additional network which accepts switching energy arising in the semiconductor upon change between conductive and blocked state. This connecting network may, for example, be in its simplest form a resistor, preferably with a capacitor in parallel to dampen voltage peaks, a Zener diode, or, in accordance with feature of the invention which is particularly energy efficient, may include a recuperating network, such as a blocking oscillator, energized by the switching energy, the energy from the blocking oscillator then being available for operation of other power consuming elements or, for example, recuperation and return to an energy source, such as a battery, after rectification.

The system has the advantage that the overall material requirements are reduced while, additionally, losses which arise upon switching of the semiconductor, likewise are reduced. Protective resistors required to protect the semiconductor against rush-in or switching-on currents are not required.

By connecting the additional or interconnecting network, which is of low resistance, to a capacitor of the network of the transistor which is not being switched, the capacity of capacitors in the unswitched network is effectively connected in parallel with the capacitors within the switched network, so that a larger capacity value is available for absorbing and temporarily storing switching energy which can be either dissipated in the single resistor or, in accordance with a feature of the invention, recuperated and, for example, fed back to the power source, such as a storage battery. A diode can be used to interconnect the two networks, so that the network can, also, effectively discharge the transferred charge from capacitors. If a choke is used which is provided to reduce the in-rush current and turn-ON switching losses, the diode can also be used to discharge the energy stored in the choke. Such a choke is desirable if the circuit is to be used to reduce switching losses in the switching-ON mode as well as in the switching-OFF mode, where capacitors are usually used to store excess switching energy and protect the respective semiconductor switch. The energy stored, upon each switching event in this network which, then, includes respectively a choke and a capacitor, can be discharged over the additional network which includes a resistor or which can be used to recuperate the energy and return it to the power source, for example. Diodes, poled in current passing or current flow directions are then used in the protective networks to permit discharge of this energy.

The additional or cross connecting network, in its simplest case, is a resistor. Such a resistor will have high voltage peaks arise thereacross, however, if switching is very rapid. It is, therefore, desirable to provide a damping capacitor in parallel thereto which dampens the voltage peaks across the resistor. Rather than using a resistor, or in connection therewith, a diode can be used which has a breakdown voltage determining the decay rate of the switching current. For higher breakdown voltages, a Zener diode is particularly suitable although the inherent conduction voltage of diodes of various types may also be utilized.

The energy can be recuperated, in accordance with a particularly energy efficient embodiment of the invention, by connecting a self-oscillating converter network thereto which, in accordance with a feature of the invention, preferably is in the form of a blocking oscillator. To suppress high voltage peaks, a capacitor is preferably connected to the voltage converter network. In accordance with a preferred form of the invention, the energy which is recuperated is fed back to the voltage supply source, so that the overall losses arising upon switching of the semiconductor elements, typically transistors, becomes particularly low. The circuit is especially useful to control operation of a direct current electric motor, in selected directions of rotation, by pulsing the semiconductor switches at varying duty cycles in dependence on output power desired from the motor. Thus, one of the transistors may be ON for an extended period of time to obtain full power from the motor in one direction; for slow operation of the motor, however, the particular transistor can be operated in pulsed ON/OFF conditions with the pulse rates and the duty cycle of the pulses determining the average power being supplied to the motor, with the direction of current flow therethrough being determined by which one of the semiconductor switches is being controlled to conduction. Motors of this type may be supplied from storage batteries and installed, for example, in self-propelled in-plant vehicles, for example fork lift or transport units, or the like; thus, efficient use of energy stored in a storage battery is particularly important, and the small additional circuitry requirements for feeding back switching energy to the storage battery may well be economically justified. Another useful application is the control operation of a alternating current or three phase motor with variable speed. The speed depends of the switching frequency of the transistor. For getting a "sinus" like current it is possible to vary the duty cycles of the pulses.

DRAWINGS

Figure 1:
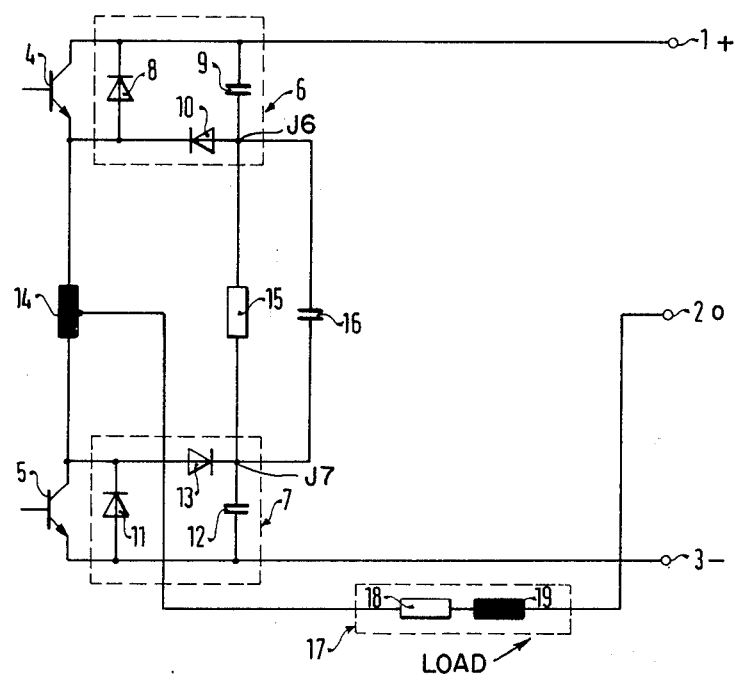
FIG. 1 is a circuit diagram of the low-loss switching network in its basic form.

Terminals 1 and 3 (FIG. 1) have, respectively, positive and negative supply voltages applied thereto. Terminal 2 is a center or neutral connection having, with respect to terminals 1 and 3, half-voltage thereacross. A load 17 is provided shown, in equivalent representation, as a resistor 18 and an inductance 19. Current flow through the load is controlled, in respectively reverse direction, by selectively controlling a transistor 4 or 5 to conduction, upon application of a suitable control voltage to the respective base of the transistor 4, 5 from a control source, not shown. The collector of transistor 4 is connected to the positive terminal 1; the emitter of the transistor 5 is connected to the negative terminal 3. The emitter of transistor 4 and the collector of transistor 5 are connected by an inductance choke 14 which has a center tap. Each one of the transistors 4, 5 has respective networks 6, 7 connected across the emitter-collector paths thereof, which networks 6, 7 are provided to reduce the switching losses of the respective semiconductor switch 4, 5.

Network 6 has two diodes 8, 10 and a capacitor 9, diode 8 being connected across the emitter-collector path of transistor 4, in reverse polarity, and a series circuit formed by capacitor 9 and diode 10 is connected across the diode 8, and hence across the collector-emitter path of transistor 4. Network 7 includes a diode 11, connected in reverse polarity across the collector-emitter path of transistor 5, and a series network formed by diode 13 and capacitor 12, connected likewise across the collector-emitter path of transistor 5, and hence across the diode 11. Diodes 8, 11 form free-wheeling diodes, as will appear. These bases of the respective semiconductor switches 4, 5 are controlled to conduction or blocking by an external control network, not shown.

The junction J6 between the capacitor 9 and diode 10 of network 6 and the junction J7 are connected by a cross-connecting additional network formed by a resistor 15. A capacitor 16 is, preferably, connected across the resistor 15. The center tap of choke 14 is connected to the load 16, the other terminal of which is connected to the neutral terminal 2 of the power supply source.

Operation: The capacitors 9, 12, connected in parallel through the resistor 15 which is of low-resistance value, form relief capacitors upon turn-OFF of a previously conducting semiconductor switch 4 and 5. The resistor 15, further, forms a discharge circuit for the choke 14 which is a protective element of turn-ON of one of the semiconductor switches 4, 5.

Let it be assumed, for example, that the external control network (not shown) provides a signal to transistor 4 which causes blocking of transistor 4, and then, with transistor 4 blocked, provides a signal which causes transistor 5 to conduct. First, turn-OFF characteristics: Assuming the foregoing steady-state conditions—transistor 4 blocked and transistor 5 conductive—capacitor 12 is discharged, whereas capacitor 9 is charged to operating voltage. Upon control of semiconductor switch 5 to blocking, then current, due to the inductive load 17, continues to flow further through diode 13 into the capacitor 12, into the capacitor 9. Capacitor 12 will be charged, capacitor 9 will be discharged by the current. Consequently, the collector voltage at the semiconductor switch rises slowly during blocking, reducing switching losses in the semiconductor 5 since overlap of the collector-emitter voltage and collector current is reduced. When capacitor 9 is discharged, diodes 8, 10 become conductive, and the lower end—with reference to FIG. 1—of the choke 14 becomes more positive than the upper one. Consequently, load current in the choke 14 reverses and starts to flow over the diode 8.

Resistor 15, thus, provides a cross connection between the previously charged capacitor 9 and, effectively places the two capacitors 9, 12 in parallel with respect to current flow to the load and reduces overlap of the collector-emitter voltage and collector current through transistor 5.

Upon turn-ON of the semiconductor switch, that is, when switch 5 is controlled to conduction, initially the full supply voltage between the terminals 1 and 3 is applied to the choke 14. Current through the choke 14 will rise exponentially in accordance with the laws of current flow through an inductance. As soon as the semiconductor switch 5 has accepted current from the diode 8, the voltage at the upper terminal of choke 14 drops, and the capacitor 9 is charged through the diode 10, whereas capacitor 12 discharges. The charge current for capacitor 9 will thereby flow over diode 10, choke 14, and the collector-emitter path—now conductive—of the semiconductor switch 5. The discharge current of capacitor 12 will flow over resistor 15 of the further, cross-connecting network, diode 10 of the network 6 of the blocked semiconductor 4, choke 14, and the collector-emitter path of the semiconductor switch 5. Choke 14 limits the recharge current of the capacitors 9 and 12, and hence the collector current through the semiconductor switch 5.

The energy which is stored in the choke 14 after each switching event is discharged over the further additional network including the resistor 15 through the diodes 13 and 10. The diodes in the networks 6, 7 are poled as shown in FIG. 1.

If, instead of switch 5, the semiconductor switch 4 is controlled ON and OFF, an equivalent sequence of charging and recharging a current flow will result. Ordinarily, it is sufficient if the further network between junctions J6 and J7 includes a resistor 15, which, preferably, is of low resistance value. High voltage peaks arise across the resistor, and high rates of current flow therethrough; it is, therefore, desirable to connect the capacitor 16 in parallel to the resistor so that voltage peaks across resistor 15 are damped. This, reduces voltage peaks which arise across the semiconductor switches 4 and 5 and the diodes 8, 11 which form freewheeling diodes and are poled reversely to the emitter junctions of the semiconductor switches 4, 5. The selection of suitable semiconductor elements 4, 5, as well as diodes 8, 11, and especially with respect to breakdown voltage, will not be critical. A further advantage of capacitor 16 is this: Disturbing effects due to self-inductance and length of the connections to the resistor 15 are eliminated.

The circuit is essentially identical to that of FIG. 1, except that the resistor 15 and capacitor 16 are replaced by a diode 20 which, as shown, is a Zener diode.

Terminal 1 is connected to the collector of semiconductor switch 4, the emitter of which is connected to choke 14. Network 6 is connected across the collector-emitter path of semiconductor switch 4 to reduce losses upon switching of the semiconductor, and is constructed identical to that of FIG. 1. The other terminal of choke 14 is connected to the collector of semiconductor switch 5, the emitter of which is connected to terminal 3 of the power supply. Semiconductor switch 5 has its emitter-collector path connected in parallel to network 7 which is identical to that of network 7 of FIG. 1, and which reduces switches losses and power to be dissipated in the semiconductor switch 5 upon switching. The center tap of the choke 4 is connected to the load 17 which, again, includes a resistor 18 and an inductance 19. Load 17 is connected to the neutral or center terminal 2 of the power supply, which has a voltage level intermediate that between terminals 1 and 3. In accordance with this feature of the invention, the capacitors 9 and 12 of the networks 6 and 7 are interconnected by the Zener diode 20.

Figure 2:
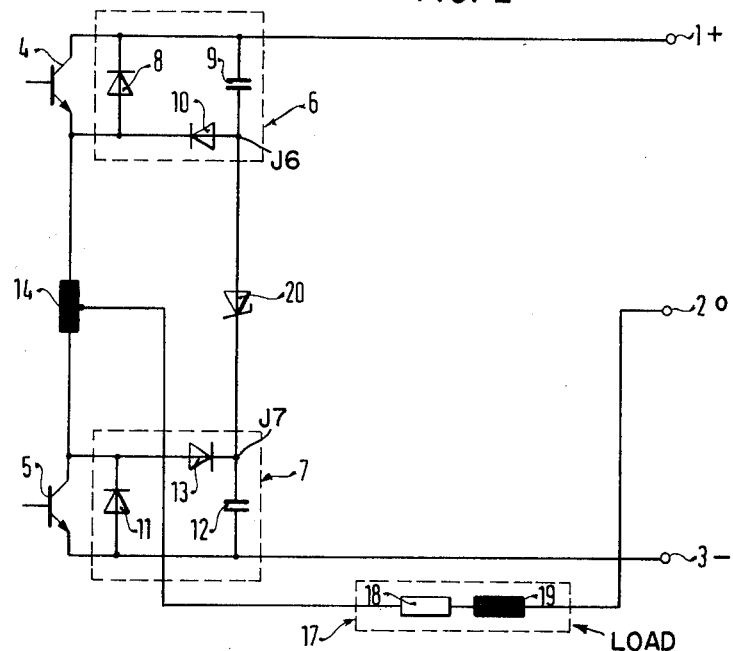
FIG. 2 illustrates another embodiment.

Basically, the operation is identical to that of FIG. 1. Current through the Zener diode 20 will flow only when its breakdown voltage is exceeded. The decay speed of the current in the choke 14 is thus largely determined by the breakdown voltage of the Zener diode 20. The selection of the Zener diode 20 with respect to its breakdown voltage should be matched to the choke, and especially its inductance, within the network. If an ordinary diode is used, the inherent conduction voltage will determine current flow therethrough. The circuit of FIG. 2 has the same advantages of the circuit of FIG. 1.

Figure 3:
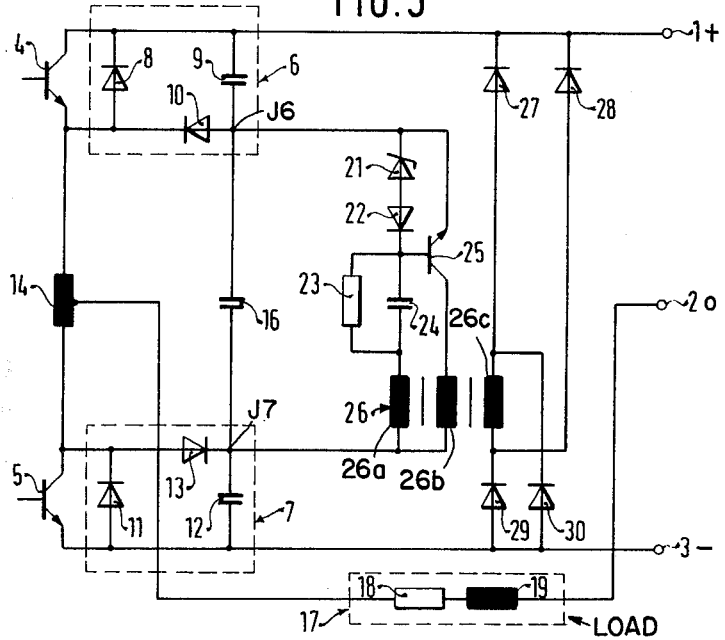
FIG. 3 is a circuit diagram of the low switching loss network permitting recuperation of switching energy.

Embodiment of FIG. 3: This circuit permits recuperation of power which, in the embodiment of FIG. 1, is dissipated in the form of heat in the resistor 14. The basic circuit is the same—terminal 1 is connected to the collector of semiconductor switch 4, the emitter of which is connected through choke 14 with the collector of semiconductor switch 5, the emitter of which is connected to terminal 3 of the power supply. Networks 6, 7, to reduce the power losses upon switching of the respective semiconductor switches 4, 5, are connected across the collector-emitter paths of the respective switches 4, 5, and can be constructed identical to those of FIG. 1. The bases of the semiconductor switches 4, 5 are controlled to conduction or blocking state from a control unit, not shown. The center tap of choke 14 is connected to the load 17 which has resistive component shown by resistor 18, and an inductive component shown by inductance 19.

The capacitors 9, 12, at junctions J6, J7, are interconnected by the additional and further network which, in accordance with a feature of the invention, comprises a network to recuperate energy arising upon changing state or switching of either one of the semiconductor switches 4, 5.

The recuperating network is in form of a blocking oscillator, formed by a transistor 25, R/C network 23, 24, and a blocking oscillator transformer 26 having a primary winding 26b, a feedback winding 26a, and a secondary winding 26c. Junction J6, connected to capacitor 9, is connected to the emitter of transistor 15. The base of the transistor 25 is connected through a diode 22 and a Zener diode 21 to the junction J6. The base of the transistor 25 is, additionally, connected to the parallel connected resistor 23 and capacitor 24, forming the R/C circuit, the other terminal of the R/C circuit being connected to one terminal of the feedback 26a of the transformer, the other terminal of which is connected to junction J7 and hence to the capacitor 12. The collector of transistor 25 is connected through primary winding 26b of the transformer 26 to junction J7 and hence to the capacitor 12. The secondary 26c of the transformer 26, across which the output energy is available, is connected to a rectifier circuit which, in proper polarity, is connected to the power supply terminals 1, 3. The rectifier is a bridge rectifier using diodes 27, 28 and diodes 29, 30, and so connected that terminal 1 has a voltage which is positive, and terminal 3 has a voltage which is negative. A peak voltage suppression or damping capacitor 16 is connected across the terminals J6, J7, as in FIG. 1.

Operation: Basically, the operation of the circuit is similar to that of FIG. 1: Capacitors 9, 12, however, are not interconnected by a mere resistor but, rather, by a blocking oscillator. The blocking oscillator, with the transistor 25 and the primary and feedback windings 26b, 26a of the transformer, are supplied with the current which, in FIG. 1, flows through the resistor 15. Operation of such a blocking oscillator is well known from the literature—see, for example, Tietze, Schenk, "Halbleitershaltungstechnik," 3rd edition, published by Springer ("Semiconductor Technology"), page 418 et seq. The voltage which is chopped by the blocking oscillator is transformed to a higher voltage level by the transformer 26, and rectified in the rectifier formed by the diodes 27-30, for feedback into the supply terminals 1, 3. Use of a voltage transformer, rather than the resistor 15, has the advantage that energy which is supplied by the switching unloading networks can be fed back to a supply source, for example a storage battery. Capacitor 16, as before, reduces voltage peaks.

Various other types of voltage transformer circuits can be used, and the blocking oscillator shown in FIG. 3 is only one suitable example. It is, of course, also possible to utilize the energy derived from such a voltage transformer in a form other than feeding it back to the supply terminals, for example the terminals across the secondary 26c—FIG. 3—can be connected to a utilization circuit or load for useful energy conversion.

Various changes and modifications may be made, and features described in connection with any one of the embodiments may be used with the others, within the scope of the inventive concept.

In a typical example, and using a supply voltage between terminals 1 and 3 of 540 V, suitable network components are:

switching transistors 4, 5: BUX 48
choke 14: 20 μH; 10m ohms
capacitors 9, 12: 22 μF
capacitor 16: 0,47 μF (FIG. 1); 6,8 μF (FIG. 3)
resistor 15: 10 ohms
Zener diode 20: 56 V (1N3334 B)
R/C circuit 23/24: 1,2K ohms; 0,22 μF
transforming ratio, windings 26a : 26b : 26c : ½ : 8 : 94

I claim:

1. Low-loss semiconductor switching circuit having a voltage supply (1, 2, 3),
a control system to control current flow, in respectively controlled direction, to a load (17) including a first controlled semiconductor switch (4);
a second controlled semiconductor switch (5);
means (14) including an inductance (17, 19) connecting together one main current terminal of the respective semiconductor switches, and further to connect said main current terminals to the load, the other main current terminals of the semiconductor switches being connected to the voltage supply;
a first network (6) connected in parallel across the main current terminals of the first semiconductor switch and including first means (9) for storing energy connected to receive and store switching energy arising upon changing of switching state of the first semiconductor switch;
a second network (7) connected in parallel across the main current terminals of the second semiconductor switch (5) and including second means (12) for storing energy connected to receive and store switching energy arising upon changing of switching state of the second semiconductor switch;
and comprising, in accordance with the invention,
an additional network (15, 16; 20; 21–26) connecting the energy storing means (9, 12) of said first network (6) and the second network (7) and carrying between said first and second networks which arise upon changing of switching state of a respective one of the semiconductor switches (4, 5),
the inductance in the means (14) connecting the main current carrying paths of the semiconductor switches receiving and storing switching energy arising upon control of one of the first or second semiconductor switches (4, 5) between conductive or turn-ON state and non-conductive, or blocked state.

2. Circuit according to claim 1, wherein said energy storage means are capacitors (9, 12) connected with one electrode to the terminal of the respective semiconductor switch (4, 5) which is also connected to the voltage supply (1, 3);
and the additional network (15, 16; 20; 21–26) is connected to the other terminal (J6, J7) of the capacitors (9, 12) to thereby interconnect said first and second networks which receive and store switching energy arising upon changing switching state of the respective semiconductor switch to which the respective first and second network is connected.

3. Circuit according to claim 2, further including a diode (10, 13), each, connecting the other terminal of the respective capacitor (9, 12) to the other terminal of the associated semiconductor switch (4, 5).

4. Circuit according to claim 1, wherein the additional network comprises a resistor (15).

5. Circuit according to claim 1, wherein the additional network includes a capacitor (16) connected across said first and second networks to suppress voltage peaks which arise upon changing of switching state of the respective first or second semiconductor switches.

6. Circuit according to claim 1, wherein (FIG. 2) the additional network comprises a diode (20).

7. Circuit according to claim 6, wherein the diode comprises a Zener diode (20).

8. Circuit according to claim 1, wherein the additional network comprises (FIG. 3) an energy recuperation network (21–26) including a voltage converter circuit.

9. Circuit according to claim 8, wherein the voltage converter circuit includes an oscillatory circuit triggered and powered by energy arising upon changing of switching state of the respective semiconductor switch represented by current flow through the additional network interconnecting the first and second networks (6, 7).

10. Circuit according to claim 9, wherein the voltage converter circuit comprises a blocking oscillator including a transformer (26) having a secondary winding (26c) and a rectifier network (27–30) connected to the secondary winding to recuperate energy in direct-current form.

11. Circuit according to claim 1, further including means (26c, 27–30) connected to the voltage converter circuit and to the voltage supply (1, 3) and feeding back recuperated energy to the voltage supply.

12. Circuit according to claim 8, further including a capacitor (16) included in the additional network and connected across the first and second networks (6, 7) and the input to the voltage converter circuit to suppress voltage peaks arising upon changing of switching state of the respective semiconductor switches (4, 5).

13. Circuit according to claim 1, wherein said means (9, 12) to receive switching energy arising upon changing of switching state of the respective semiconductor switch (4, 5) comprises a capacitor (9, 12) in the respective first and second networks (6, 7) receiving and storing switching energy arising upon changing of switching state of the respective semiconductor switch.

14. Circuit according to claim 1 wherein the additional network comprises a resistance-capacitor circuit (15, 16).

15. Circuit according to claim 1 wherein the additional network comprises a parallel resistor-capacitor circuit (15, 16).

* * * * *